United States Patent [19]

Bystrova et al.

[11] 4,004,052

[45] Jan. 18, 1977

[54] PROCESS FOR PRODUCING NON-POROUS COATING FOR CORUNDUM SUBSTRATES

[76] Inventors: Vera Ivanovna Bystrova, ulitsa Sojuza Svyazi, 8, kv. 28; Galina Konstantinovna Kirillova, Baskov pereulok, 19, kv. 18; Galina Atkhipovna Mikhailova, Liteiny prospekt 46, kv. 13, all of Leningrad, U.S.S.R.

[22] Filed: Dec. 1, 1975

[21] Appl. No.: 636,446

Related U.S. Application Data

[63] Continuation of Ser. No. 449,509, March 8, 1974, abandoned, which is a continuation of Ser. No. 300,235, Oct. 24, 1972, abandoned.

[52] U.S. Cl. .................... 427/374 F; 427/193; 427/376 A; 427/399; 428/420; 428/428; 428/446; 428/539

[51] Int. Cl.² ..................... B05D 3/02; B32B 9/04; B32B 13/04

[58] Field of Search ........... 427/193, 374 F, 376 A, 427/399; 428/420, 428, 446, 539

[56] References Cited

UNITED STATES PATENTS

| | | |
|---|---|---|
| 3,023,492 | 3/1962 | Bristow ..................... 427/123 X |
| 3,049,447 | 8/1962 | Knapp ..................... 427/374 F X |
| 3,384,508 | 5/1968 | Bopp et al. ..................... 427/376 A |
| 3,473,999 | 10/1969 | Muchow ..................... 427/374 F X |
| 3,676,204 | 7/1972 | Eppler ..................... 427/374 F X |
| 3,679,464 | 7/1972 | Eppler ..................... 427/374 F X |
| 3,808,046 | 4/1974 | Davey ..................... 427/376 A X |

OTHER PUBLICATIONS

*Silica and the Silicates,* Audley, 1921, p. 217.

*Primary Examiner*—Ralph Husack
*Assistant Examiner*—Shrive P. Beck
*Attorney, Agent, or Firm*—Holman & Stern

[57] ABSTRACT

A process for producing a non-porous coating for corundum substrates with a corundum content of 90 to 100% the process comprises applying a barium, calcium or strontium alumosilicate glaze to the substrate, followed by heat treatment of the substrate at a temperature within a range of from 1,350 to 1,650° C at a heating rate of from 100° to 500° C per hour, and thereafter cooling at a rate of about 150° C per hour, thus giving a glass-ceramic coating on the substrate. The process is useful, mainly, for producing integral circuits and other micro-circuits and precision resistors.

1 Claim, No Drawings

PROCESS FOR PRODUCING NON-POROUS COATING FOR CORUNDUM SUBSTRATES

This is a continuation of application Ser. No. 449,509 filed Mar. 8, 1974 and now abandoned which in turn is a Rule 60 continuation of Ser. No. 300,235 filed Oct. 24, 1972 and now abandoned.

BACKGROUND OF THE INVENTION

The present invention relates to radio-electronic technology and, more specifically, to processes for producing non-porous coatings on corundum substrates.

The present invention is useful for the production of integral circuits and other micro-circuits as well as precision resistors.

Recently there have been developed low-porous (porosity up to 1–3%) ceramic substrates; nevertheless, the progress in miniaturization of micro-circuits imposes more stringent requirements upon the surface quality of such substrates. Ceramic corundum substrates now in use in electronics for some types of integral and other micro-circuits can withstand, unlike glass and ceramic glass, temporary action of high temperatures above 1,000° C and have better mechanical, electrical characteristics and greater thermal conductivity.

One approach to the improvement of the surface quality of ceramic substrates resides now in glazing thereof, i.e. applying glaze on the surface of ceramic corundum substrates with the corundum content of 90 to 100%, followed by heat-treating thereof.

This prior-art process of glazing is, however, applicable only for corundum substrates having surface roughness corresponding to the surface finish of class 10 and does not prevent such a defect as undulation, while a thickness of a well-formed glaze layer is at least 20 to 60 mom. A glaze layer of such thickness impairs electrical properties and lowers thermal conductivity of substrates.

Furthermore, a disadvantage of said prior-art process that the operating temperature of glazed substrates does not exceed 700° or 800° C.

SUMMARY OF THE INVENTION

The present invention is directed to the provision of such a process for producing a non-porous coating for corundum substrates which would make it possible to employ, for the purpose of glazing thereof, corundum substrates with the surface roughness corresponding to the surface finish of class 6 and retain their high physico-mechanical and electrical properties, ensure the production of corundum substrates with a non-porous surface similar to that of ceramic glasses and having roughness of 14 or better and enable the production of coatings with an increased operating temperature as compared to glazes employed at present for corundum substrates.

This object is accomplished by providing a process for producing a non-porous coating for corundum substrates with the corundum content of 90 to 100% by applying a glaze, followed by heat-treating, according to the present invention, in order to obtain a glass-ceramic coating on a substrate. The heat-treatment of glazed corundum substrates is effected at a temperature within a range of from 1,350° to 1,650° C at a heating rate of from 100° to 500° C per hour, whereafter the substrates are cooled at a rate of about 150° C per hour.

The process of the present invention makes it possible to employ, for the purpose of glazing, corundum substrates with the surface roughness of 6, whereas the surface roughness of the resulting coating, after machining, comes to 14; the process enables reducing the consumption of abrasive materials, since the hardness of the resulting coating is much lower than that of corundum substrates. A non-porous coating produced in accordance with the process of the present invention does not impair electrical properties and thermal conductivity of corundum substrates, since the glaze partially dissolves corundum of the substrate and crystallizes, due to predetermined heat-treatment conditions. An operating temperature of glazed corundum substrates produced by the process of the present invention is as high as 1,250° C and mechanical strength thereof is increased by 65%.

DETAILED DESCRIPTION OF THE INVENTION

The present invention will become more fully apparent from the following detailed description.

The process for producing a non-porous coating for corundum substrates consists in the following.

To produce coatings possessing good dielectric properties, corundum substrates are coated with a fritted, alkali-free, lead-free, barium calcium or strontium alumosilicate glaze. Prior to coating, the glaze is founded at the temperature of 1,500° C, ground to particles of not more than 3 mcm in size, and then applied onto corundum substrates with the surface roughness of 6 and more by any conventional method. The glaze composition is formulated so that corundum of the superficial layer of the substrate may react with the glaze. Then, the glazed substrates are heated at a heating rate of 100° to 500° C per hour to 1,350°–1,650° C exceeding the temperature (1,200° to 1,350° C) generally used for the heat-treatment of glazed articles. At the above-mentioned temperatures the glaze is spread over the substrate and dissolves its superficial layer, whereby the original composition of the coating is changed due to the enrichment with corundum which, in this case, is an efficient catalyst for the formation of an opaque glass-ceramic coating consisting of anorthite, celsian or strontium feldspars having, in respect of the substrate, almost the same dielectric constant and a somewhat lower thermal expansion coefficient as compared to corundum materials, in order to preclude the formation of tension strains lowering, as it is well known, the mechanical strength of glazed articles. After heating, glazed substrates are cooled at a rate of about 150° C per hour.

The description of specific examples illustrating different conditions of heat-treating corundum substrates with various corundum content is given hereinbelow.

EXAMPLE 1

A layer of a calcium alumosilicate glaze was applied to a corundum substrate containing 90% of $Al_2O_3$.

Next heat treatment of the glazed substrate was conducted according to the following scheme: heating to the temperature of 1,350° C at the heating rate of 100° C per hour and cooling at the rate of 150° C per hour.

As a result, a glass-ceramic coating was formed on the substrate consisting of anorthite feldspar $CaO.Al_2O_3.2SiO_2$.

EXAMPLE 2

A layer of a barium alumosilicate glaze was applied to a corundum substrate cntaining 100% of $Al_2O_3$.

Next heat treatment of the glazed substrate was conducted in accordance with the following scheme: heating to the temperature of 1,650° C at the heating rate of 500° C per hour and cooling at the rate of 150° C per hour.

As a result, a glass-ceramic coating was formed on the substrate consisting of celsian feldspar $BaO.Al_2O_3.2SiO_2$.

EXAMPLE 3

A layer of a calcium alumosilicate glaze was applied to a corundum substrate containing 96% of $Al_2O_3$.

Next heat treatment of the glazed substrate was conducted in accordance with the following scheme: heating to the temperature of 1,450° C at the heating rate of 150° C per hour and cooling at the rate of 150° C.

As a result, a glass-ceramic coating was formed on the substrate consisting of anorthite feldspar $CaO.Al_2O_3.2SiO_2$.

EXAMPLE 4

A layer of a strontium alumosilicate glaze was applied to a corundum substrate containing 99% of $Al_2O_3$.

Next heat treatment of the glazed substrate was conducted in accordance with the following scheme: heating to the temperature of 1,550° C at the heating rate of 500° C per hour, followed by cooling at the rate of 150° C per hour.

As a result, a glass-ceramic coating was formed on the substrate consisting of strontium feldspar $SrO.Al_2O_3.2SiO_2$.

EXAMPLE 5

A layer of a barium alumosilicate glaze was applied to a corundum substrate containing 95% of $Al_2O_3$.

Next heat treatment of the glazed substrate was conducted according to the following scheme: heating to the temperature of 1,550° C at the heating rate of 300° C per hour, followed by cooling at the rate of 150° C.

As a result, a glass-ceramic coating was formed on the substrate consisting of celsian feldspar $BaO.Al_2O_3.2SiO_2$.

EXAMPLE 6

A layer of a strontium alumosilicate glaze was applied to a corundum substrate containing 96% of $Al_2O_3$.

Next heat treatment of the glazed substrate was conducted in accordance with the following scheme: heating to the temperature of 1,500° C at the heating rate of 250° C per hour, followed by cooling at the rate of 150° C per hour.

As a result, a glass-ceramic coating was formed on the substrate consisting of strontium feldspar $SrO.Al_2O_3.2SiO_2$.

Thickness of the coating layer may vary within the range of from 10 to 100 mcm, depending on micro-relief of the corundum substrate to be coated. A coating with 40 mcm thickness does not impair electrical properties of corundum substrates at a frequency of $10^{10}$ Hz, while a 100 mcm coating does not impair electrical properties at a frequency of $10^6$ Hz and does not reduce thermal conductivity of corundum substrates.

The structure of the resulting coating is more regular and denser than those of coatings produced by the known processes, like ceramic glasses, and contains 90% of the crystalline phase of anorthite, celsian or strontium feldspars, and 10% of the residual vitreous phase.

In the foregoing description, the classes of surface finish or roughness given refer to the classes in accordance with USSR State Standard GOST 2789--59, entitled "Roughness of Surface" (Russian edition). For example, class 10 corresponds to a height of surface irregularities not exceeding 0.8 $\mu$cm, and class 14 corresponds to a height of surface irregularities not exceeding 0.05 $\mu$cm.

We claim:

1. A process for producing a non-porous coating for corundum substrates having a corundum content of 90 to 100%, comprising applying a barium, calcium or strontium alumosilicate glaze layer onto said corundum substrate and heat treating the same at a temperature within the range of from 1,350° to 1,650° C at a heating rate of from 100° to 500° C per hour, and thereafter cooling at a rate of about 150° C per hour, whereby corundum from the surface layer of said substrate reacts with said glaze thus forming a barium, calcium or strontium feldspar glass-ceramic coating on the substrate.

* * * * *